(12) United States Patent
Byun et al.

(10) Patent No.: US 8,263,854 B2
(45) Date of Patent: Sep. 11, 2012

(54) ENCAPSULANT SHEET FOR SOLAR CELL MODULE AND SOLAR CELL MODULE INCLUDING SAME

(75) Inventors: Ki Nam Byun, Suwon-si (KR); Yong Lae Yi, Anyang-si (KR); Kyoung-Soo Song, Seoul (KR); Gun Uk Kim, Anyang-si (KR)

(73) Assignee: SKC Co., Ltd, Suwon-si (KR)

( * ) Notice: Subject to any disclaimer, the term of this patent is extended or adjusted under 35 U.S.C. 154(b) by 0 days.

(21) Appl. No.: 13/126,590

(22) PCT Filed: Dec. 1, 2009

(86) PCT No.: PCT/KR2009/007096
§ 371 (c)(1),
(2), (4) Date: Apr. 28, 2011

(87) PCT Pub. No.: WO2010/064821
PCT Pub. Date: Jun. 10, 2010

(65) Prior Publication Data
US 2011/0203642 A1   Aug. 25, 2011

(30) Foreign Application Priority Data
Dec. 2, 2008   (KR) .................. 10-2008-0121324

(51) Int. Cl.
*H01L 31/042*   (2006.01)
*H01L 33/52*   (2010.01)
*H02N 6/00*   (2006.01)
*B44C 5/04*   (2006.01)

(52) U.S. Cl. ......... 136/251; 136/244; 156/219; 156/220

(58) Field of Classification Search .................. None
See application file for complete search history.

(56) References Cited

U.S. PATENT DOCUMENTS

| | | | | |
|---|---|---|---|---|
| 4,035,549 A | * | 7/1977 | Kennar | 428/409 |
| 4,452,840 A | * | 6/1984 | Sato et al. | 428/156 |
| 4,925,725 A | * | 5/1990 | Endo et al. | 428/156 |
| 5,425,977 A | * | 6/1995 | Hopfe | 428/141 |
| 6,075,202 A | * | 6/2000 | Mori et al. | 136/251 |
| 6,093,471 A | | 7/2000 | Hopfe | |
| 2002/0179139 A1 | * | 12/2002 | Hashimoto et al. | 136/251 |

(Continued)

FOREIGN PATENT DOCUMENTS

EP   1 184 912 A1   3/2002

(Continued)

OTHER PUBLICATIONS

European Patent Office, European Search Report issued on Feb. 1, 2012 in a counterpart European Application No. 09 83 0559.

(Continued)

*Primary Examiner* — Jennifer Michener
*Assistant Examiner* — Christopher Danicic
(74) *Attorney, Agent, or Firm* — Sughrue Mion, PLLC

(57) ABSTRACT

An encapsulant sheet for solar cell modules comprising a transparent soft resin film having a plurality of hemispherical concave parts of varying sizes formed on one or both surfaces of the transparent soft resin film, can disperse pressure generated in the process of combining the encapsulant sheet and a solar battery cell to prevent damage to the solar battery cell and suppress bubble generation by allowing air to escape easily.

4 Claims, 3 Drawing Sheets

U.S. PATENT DOCUMENTS

| | | | |
|---|---|---|---|
| 2003/0098060 A1* | 5/2003 | Yoshimi | 136/251 |
| 2004/0053008 A1 | 3/2004 | Kim | |
| 2004/0173256 A1* | 9/2004 | Kageyama et al. | 136/246 |
| 2004/0229394 A1* | 11/2004 | Yamada et al. | 438/66 |
| 2005/0287341 A1* | 12/2005 | Nakajima et al. | 428/156 |
| 2007/0042160 A1* | 2/2007 | Nakajima et al. | 428/156 |
| 2008/0017241 A1* | 1/2008 | Anderson et al. | 136/251 |
| 2008/0053516 A1* | 3/2008 | Hayes | 136/251 |
| 2008/0099064 A1* | 5/2008 | Hayes | 136/251 |
| 2008/0264481 A1 | 10/2008 | Hayes | |
| 2009/0114279 A1* | 5/2009 | Zhao et al. | 136/256 |
| 2009/0126780 A1* | 5/2009 | Sung | 136/251 |
| 2010/0126557 A1* | 5/2010 | Chou | 136/251 |

FOREIGN PATENT DOCUMENTS

| | | |
|---|---|---|
| EP | 1 233 007 A1 | 8/2002 |
| JP | 2000-183388 A | 6/2000 |
| JP | 2002-185027 A | 6/2002 |
| JP | 2005-222941 A | 8/2005 |
| JP | 2010-221673 | 10/2010 |
| WO | WO2007/037649 * | 4/2007 |

OTHER PUBLICATIONS

Japanese Patent Office, Office Action issued on Apr. 3, 2012 in a counterpart Japanese Application No. 2011-533123.

* cited by examiner

ENCAPSULANT SHEET FOR SOLAR CELL MODULE AND SOLAR CELL MODULE INCLUDING SAME

FIELD OF THE INVENTION

The present invention relates to an encapsulant sheet for solar cell module and a solar cell module comprising the same.

BACKGROUND OF THE INVENTION

Solar cells are the main component of a solar photovoltaic system that converts the energy of sunlight directly into electrical energy, and can be prepared by using monocrystalline, polycrystalline or amorphous silicon-based semi-conductors.

Several or dozens of solar cells are usually interconnected in series or parallel and packaged to form a solar cell module with other units to protect the cells for a long period.

Recently, in consideration of environmental or energy problems, solar cells are becoming more important and extensive research and development have been carried out. A typical solar cell module, as shown in FIG. 1, is composed of a glass substrate (11) as a protective transparent unit on the front, a back protective film (14) as a protective unit on the back, and a solar cell (13) encapsulated by two encapsulant sheets (12*a*, 12*b*). Such solar cell module is prepared by sequentially laminating a glass substrate (11), an encapsulant sheet (12*a*), a solar cell (13), an encapsulant sheet (12*b*), and a back protective film (14), followed by heating and pressing the stacked components to harden the encapsulant sheets (12*a*, 12*b*) by cross-linking so that an integrated module can be obtained.

The encapsulation process of the solar cell module is conducted by heating the stacked components to melt the encapsulant sheets, applying pressure and degassing. In the process, the encapsulant sheets containing cross-linking agents are subjected to a cross-linking reaction by heat so that the solar cell is combined between the glass substrate and the back protective film to obtain a solar cell module.

Generally, a transparent soft resin sheet, e.g., an ethylene-vinyl acetate (EVA) copolymer, comprising cross-linking agents is used as an encapsulant sheet for solar cell modules.

However, conventional methods have the problem that a solar cell module may crack by applied pressure during the process for adhering encapsulant sheets to solar cells. Further, when cross-linking reactions are carried out under insufficient degas levels, air bubbles can be generated in the solar cell module, leading to a lower generation efficiency and deterioration of reliability. In order to solve such problems, Japanese Patent Laid-open Publication No. 2000-183388 discloses an encapsulant sheet for solar cell modules comprising continuous embossed parts having a height of 15 to 50 μm formed on the surface. The embossed parts are formed to improve fusion-adhesive or pressure-adhesive properties during a lamination process and to cushion solar cells when they are combined with encapsulant sheets.

Further, Japanese Patent Laid-open Publication No. 2002-185027 discloses an encapsulant sheet having a plurality of concave and/or convex parts formed on the surface by embossing. Particularly, it is disclosed that the convex parts formed on the encapsulant sheet may have a hemispherical shape having a diameter ranging from 0.1 to 2 mm and a height ranging from 20 to 95% of the thickness of the film and the total area of the convex parts is preferably 1 to 50% of the film area.

However, such encapsulant sheets are still insufficient to prevent solar cell damage and air bubble generation, and therefore, more improved encapsulant sheets are required.

SUMMARY OF THE INVENTION

Accordingly, it is an object of the present invention to provide an improved encapsulant sheet which can prevent cell damage and air bubble generation, and a solar cell module comprising the same.

In accordance with one aspect of the present invention, there is provided an encapsulant sheet for solar cell modules, comprising a transparent soft resin film and a plurality of hemispherical concave parts of varying sizes formed on one or both surfaces of the transparent soft resin film. In accordance with another aspect of the present invention, there is provided a solar cell module comprising the encapsulant sheet for solar cell modules.

The encapsulant sheet for solar cell modules of the present invention, which comprises a plurality of hemispherical concave parts of varying sizes formed on one or both surfaces thereof, can disperse pressure applied in the process of combining the encapsulant sheets with a solar cell to prevent solar cell damage and suppress air bubble generation by allowing air to escape easily.

BRIEF DESCRIPTION OF THE DRAWINGS

The above and other objects and features of the present invention will become apparent from the following description of the invention, when taken in conjunction with the accompanying drawings, which respectively show.

DESCRIPTION OF THE SYMBOLS

11, 41: glass substrate
12*a*, 12*b*: conventional encapsulant sheet
42*a*, 42*b*: encapsulant sheet according to an embodiment of the present invention
13, 43: solar cell
14, 44: back protective film
d1: diameter of the hemispherical concave part
h: depth of the hemispherical concave part
L1: long axis length of the hemispherical concave part
L2: short axis length of the hemispherical concave part
d: thickness of the sheet

DETAILED DESCRIPTION OF THE INVENTION

Hereinafter, the present invention is described in detail.

Figure 1:
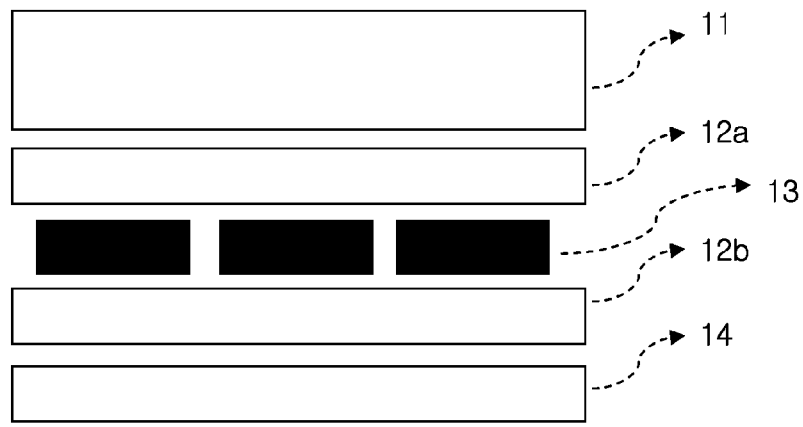
FIG. 1: a schematic view of a solar cell module comprising conventional encapsulant sheets.
Figure 2:
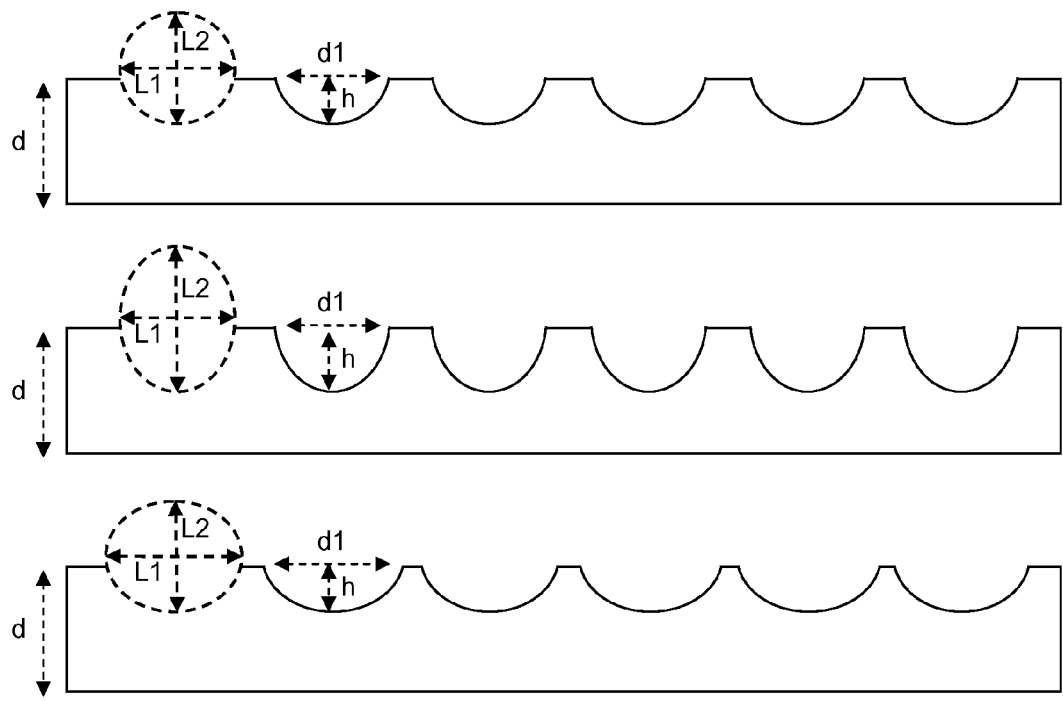
FIG. 2: a cross-sectional view of the hemispherical concave parts according to an embodiment of the present invention.

As shown in FIG. 2, the hemispherical concave parts formed on the encapsulant sheet have a circle or oval shape depending upon the ratio of a long axis length (L1) to a short axis length (L2). In the hemispherical concave part, the long axis length (L1) preferably ranges from 100 to 1500 μm, particularly from 500 to 1200 μm, and the short axis length (L2) preferably ranges from 100 to 1500 μm, particularly from 500 to 1200 μm. A depth of the hemispherical concave part is preferably half the short axis length (L2) or less. A diameter (d1) of the hemispherical concave part preferably ranges from 100 to 1500 μm, particularly from 500 to 1200 μm, and a depth (h) preferably ranges from 50 to 750 μm, particularly from 200 to 600 μm. A thickness (d) of the encapsulant sheet preferably ranges from 200 to 1000 μm, particularly from 300 to 800 μm.

According to one embodiment of the present invention, the hemispherical concave parts comprises 10 to 50% of hemispherical concave parts having a diameter (d1) of 500 to 750 μm and a depth (h) of 200 to 300 μm; 45 to 60% of hemispherical concave parts having a diameter (d1) of 750 to 1000 μm and a depth (h) of 300 to 400 μm; and 5 to 30% of hemispherical concave parts having a diameter (d1) of 1000 to 1200 μm and a depth (h) of 400 to 450 μm, based on the total number of the hemispherical concave parts.

Figure 3:
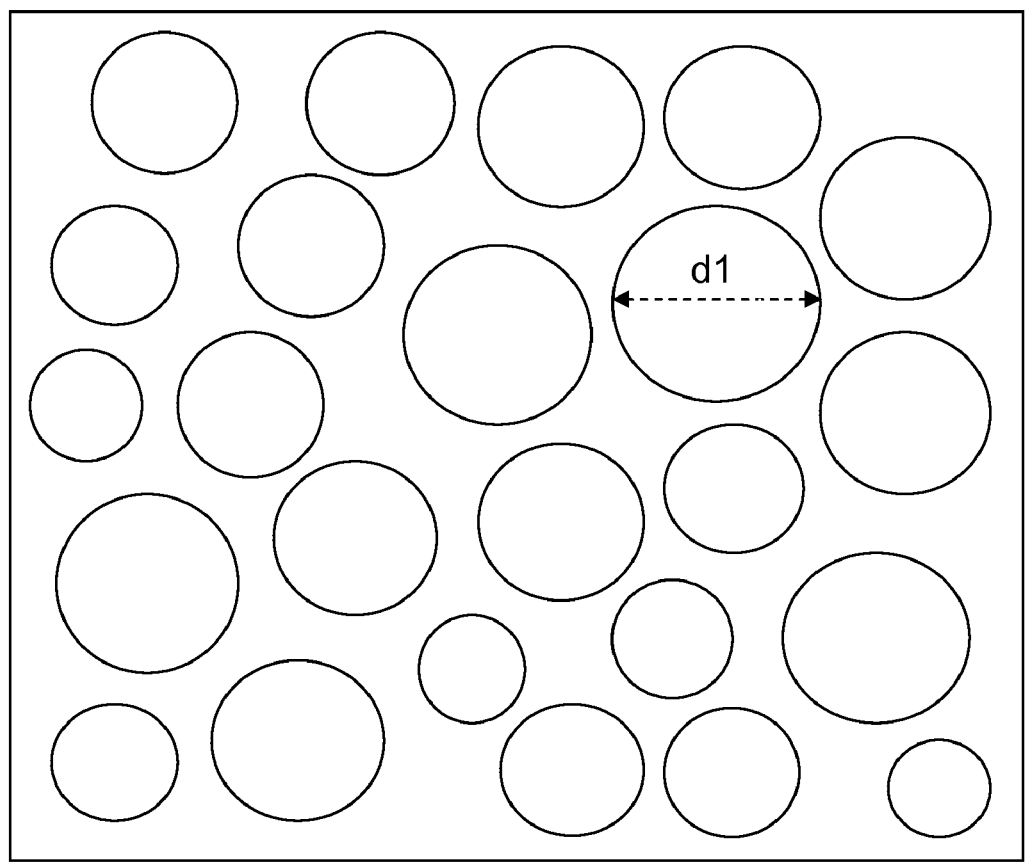
FIG. 3: a plane view of the hemispherical concave parts according to an embodiment of the present invention.

According to another embodiment of the present invention, the hemispherical concave parts comprises 30 to 60% of hemispherical concave parts having a diameter (d1) of 750 to 1000 μm and a depth (h) of 300 to 400 μm; and 40 to 70% of hemispherical concave parts having a diameter (d1) of 1000 to 1200 μm and a depth (h) of 400 to 450 μm, based on the total number of the hemispherical concave parts As shown in FIG. 3, the encapsulant sheet for solar cell modules of the present invention has a plurality of hemispherical concave parts whose sizes are different from one another formed on one or both surfaces of a transparent soft resin film. Further, as shown in FIG. 3, the hemispherical concave parts are preferably arranged in a random pattern.

Figure 4:
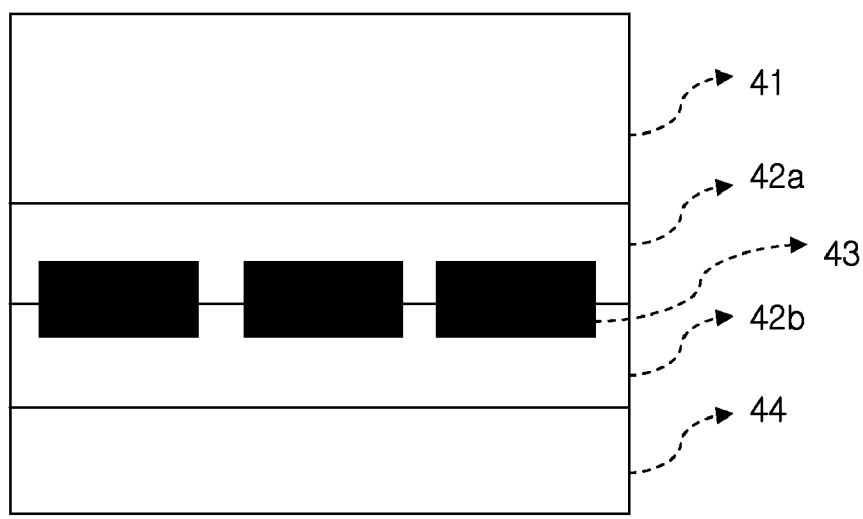
FIG. 4: a schematic view of the solar cell module comprising the inventive encapsulant sheets.

As shown in FIG. 4, the solar cell module of the present invention may be prepared by sequentially laminating glass substrate (41), an encapsulant sheet (42a), a solar cell (43), an encapsulant sheet (42b) and a back protective film (44). In the process of lamination, the hemispherical concave parts of varying sizes formed on the encapsulant sheet (42a, 42b) disperse the pressure applied to the solar cell (43), thereby only a low pressure is applied to the solar cell to prevent solar cell damage. Further, the hemispherical concave parts allow air to escape easily through the concave spaces to suppress air bubble generation. The encapsulant sheets (42a, 42b) are then heat-treated under pressure and cured by cross-linking so that an integrated solar cell module can be obtained.

In the present invention, an ethylene-vinyl acetate (EVA) resin may be used as the transparent soft resin of the encapsulant sheet.

The EVA resin composition used in the present invention preferably has a melt flow rate of 0.7 to 50 g/10 min, particularly 10 to 45 g/10 min.

In order to improve the weatherability, the EVA resin composition used in the present invention may comprise a crosslinking agent, for example, organic peroxides which generate radicals at 100° C. or more and preferably have a half-life of at least 10 hours and a decomposition temperature of at least 70° C. when considering the stability of mixing. Exemplary organic peroxides are 2,5-dimethylhexane-2,5-dihydroperoxide, 2,5-dimethyl-2,5-di(t-butylperoxy)hexane, 3-di-t-butylperoxide, α,α'-bis(t-butylperoxyisopropyl)benzene, n-butyl-4,4-bis(t-butylperoxy)butane, 2,2-bis(t-butylperoxy)butane, 1,1-bis(t-butylperoxy)cyclohexane, 1,1-bis(t-butylperoxy)-3,3,5-trimethylcyclohexane, t-butylperoxybenzoate, benzoyl peroxide, etc. Such organic peroxides may be added in an amount of 5 parts by weight or less, preferably 0.3 to 2 parts by weight, based on 100 parts by weight of the EVA resin.

Further, in order to enhance the adhesive property of the encapsulant sheet, a silane coupling agent may be added to the EVA resin. As the silane coupling agent, a typical silane coupling agent such as γ-chloropropyl trimethoxysilane, vinyl trichlorosilane, vinyl-tris-(β-methoxyethoxy)silane, γ-methoxypropyl trimethoxysilane, β-(3,4-ethoxycyclohexyl)ethyl trimethoxysilane and γ-mercaptopropyl trimethoxysilane may be used.

Such silane coupling agent may be added in an amount of 5 parts by weight or less, preferably 0.1 to 2 parts by weight, based on 100 parts by weight of the EVA resin.

Further, in order to increase the gel fraction of the EVA resin and improve the durability, a crosslinking coagent may be added to the EVA resin. A crosslinking coagent having three functional groups, e.g., triallyl isocyanurate and triallyl isocyanate, and a crosslinking coagent having one functional group, e.g., ester, may be used. Such crosslinking coagent may be added in an amount of 10 parts by weight or less, preferably 0.1 to 3 parts by weight, based on 100 parts by weight of the EVA resin.

Further, in order to enhance the stability, the EVA resin may comprise hydroquinone, methylethylhydroquinone, p-benzoquinone, methyl hydroquinone and the like, in an amount of 5 parts by weight or less, based on 100 parts by weight of the EVA resin.

Besides, if necessary, coloring agents, UV absorbents, anti-aging agents, anti-discoloration agents may be added to the EVA resin. Exemplary coloring agents are an inorganic pigment such as a metal oxide and a metal powder; and an organic pigment such as an azo lake, a phthalocyanine lake, and an acidic or basic dye lake. Exemplary UV absorbents are a benzophenone-based compound such as 2-hydroxy-4-octoxybenzophenone and 2-hydroxy-4-methoxy-5-sulfonylbenzophenone; a benzotriazole-based compound such as 2-(2-hydroxy-5-methylphenyl)benzotriazole; and a salicylate-based compound such as phenyl salicylate and p-t-butylphenyl salicylate. Exemplary anti-aging agents are an amine-based compound, a phenol-based compound and a bisphenyl-based compound, such as t-butyl-p-cresol and bis-(2,2,6,6-tetramethyl-4-piperazyl)sebacate.

The encapsulant sheet of the present invention can be prepared by casting an EVA resin composition through T-die extrusion or calendering process to obtain a sheet having a thickness of 200 to 1000 μm, followed by embossing one or both surfaces of the sheet in a desired pattern.

A solar cell module comprising the encapsulant sheet of the present invention can be prepared by sequentially laminating a glass substrate, the encapsulant sheet, a solar cell, the encapsulant sheet, and a back protective film, followed by heating and pressing the resulting laminate using a vacuum laminator under predetermined conditions such as a temperature of 100 to 150° C., a degassing time of 4 to 12 minutes, a pressing pressure of 0.5 to 1 atm, and a pressing time of 8 to 45 minutes. The encapsulant sheet of the present invention can effectively prevent solar cell damage during heating and pressing processes by cushioning the solar cell so that a high-quality product can be obtained in a high yield.

Hereinafter, the present invention is described more particularly with the following examples. However, the following examples are intended to further illustrate the present invention without limiting its scope.

Example 1

100 parts by weight of EV150 (Mitsui-Dupont Chemicals Inc.; melt flow index: 30 g/10 min) as an EVA resin, 1.5 parts by weight of Luporox101 (Alchema Ltd.) as a crosslinking agent, 0.5 parts by weight of Z-6030 (Dow-Corning Inc.) as a silane coupling agent, and 0.2 parts by weight of UV531 (Cytec Inc.) as a stabilizing agent, 0.2 parts by weight of Tinuvin770 (Ciba Specialty Chemicals Inc.), and 0.2 parts by weight of Irganox1076 (Ciba Specialty Chemicals Inc.) were mixed to obtain a resin composition for self-adhesive surface protective films (EVA).

The resin composition for self-adhesive surface protective films (EVA) was subjected to a T-die extrusion or a calendering process to obtain an encapsulant sheet having a size of 1000 μm×1000 μm and a thickness (d) of 600 μm, one surface of the sheet having hemispherical concave parts arranged in a random pattern.

The hemispherical concave parts formed on one surface of the sheet comprises 50% of hemispherical concave parts having a diameter (d1) of 500 to 750 μm and a depth (h) of 200 to 300 μm; 45% of hemispherical concave parts having a diameter (d1) of 750 to 1000 μm and a depth (h) of 300 to 400 μm; and 5% of hemispherical concave parts having a diameter (d1) of 1000 to 1200 μm and a depth (h) of 400 to 450 μm.

Next, a low-iron tempered glass substrate, the encapsulant sheet, a solar cell (Q6LM, Q-Cell), the encapsulant sheet, and a back protective film (Dunsolar 700, Dunmore Corp.) were sequentially laminated so that the solar cell contacts with the hemispherical concave parts and then the laminate was heat-treated at a temperature of 150° C., degassed for 4 minutes and pressed under 1 atm for 15 minutes to obtain 100 samples of the solar cell module.

Example 2

The procedure of Example 1 was repeated except that the hemispherical concave parts formed on one surface of the sheet comprises 10% of hemispherical concave parts having a diameter (d1) of 500 to 750 μm and a depth (h) of 200 to 300 μm; 60% of hemispherical concave parts having a diameter (d1) of 750 to 1000 μm and a depth (h) of 300 to 400 μm; and 30% of hemispherical concave parts having a diameter (d1) of 1000 to 1200 μm and a depth (h) of 400 to 450 μm, based on the total number of the hemispherical concave parts, to obtain 100 samples of the solar cell module.

Example 3

The procedure of Example 1 was repeated except that the hemispherical concave parts formed on one surface of the sheet comprises 60% of hemispherical concave parts having a diameter (d1) of 750 to 1000 μm and a depth (h) of 300 to 400 μm; and 40% of hemispherical concave parts having a diameter (d1) of 1000 to 1200 μm and a depth (h) of 400 to 450 μm, based on the total number of the hemispherical concave parts, to obtain 100 samples of the solar cell module.

Example 4

The procedure of Example 1 was repeated except that the hemispherical concave parts formed on one surface of the sheet comprises 50% of hemispherical concave parts having a diameter (d1) of 750 to 1000 μm and a depth (h) of 300 to 400 μm; and 50% of hemispherical concave parts having a diameter (d1) of 1000 to 1200 μm and a depth (h) of 400 to 450 μm, based on the total number of the hemispherical concave parts, to obtain 100 samples of the solar cell module.

Example 5

The procedure of Example 1 was repeated except that the hemispherical concave parts formed on one surface of the sheet comprises 30% of hemispherical concave parts having a diameter (d1) of 750 to 1000 μm and a depth (h) of 300 to 400 μm; and 70% of hemispherical concave parts having a diameter (d1) of 1000 to 1200 μm and a depth (h) of 400 to 450 μm, based on the total number of the hemispherical concave parts, to obtain 100 samples of the solar cell module.

Comparative Example 1

The procedure of Example 1 was repeated except that an encapsulant sheet having a size of 1000 μm×1000 μm and a thickness (d) of 600 μm was prepared to have flat surfaces, to obtain 100 samples of the solar cell module.

Comparative Example 2

Figure 5:
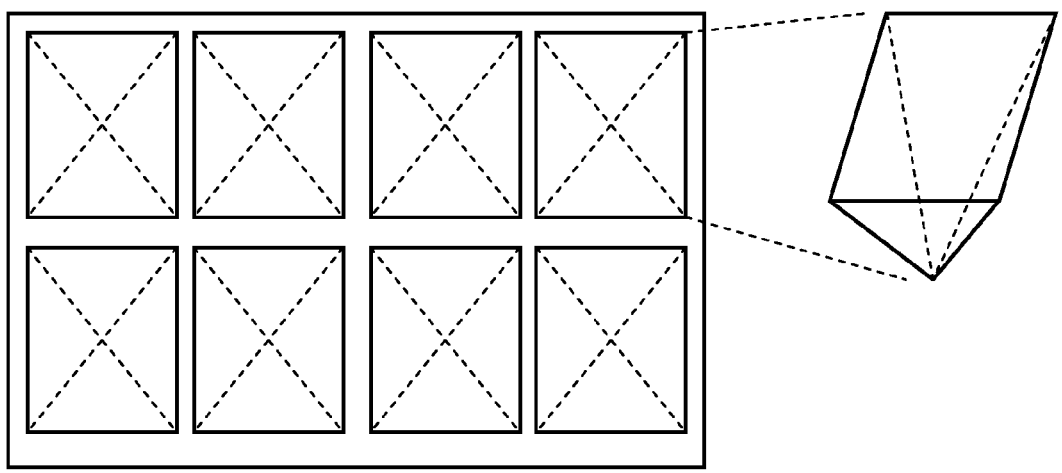
FIG. 5: a plane view of pyramidal concave parts which are provided as a comparative example.

The procedure of Example 1 was repeated except that an encapsulant sheet having a size of 1000 μm×1000 μm and a thickness (d) of 600 μm was prepared to have pyramidal concave parts (see FIG. 5) having a depth of 400 μm at an interval of 100 μm on one surface of the sheet, to obtain 100 samples of the solar cell module.

Test

The samples obtained in Examples 1 to 5 and Comparative Examples 1 and 2, were respectively measured on the number of samples having defects due to air bubble generation or solar cell damage, and the results are summarized in Table 1 below.

TABLE 1

|  | Ex. 1 | Ex. 2 | Ex. 3 | Ex. 4 | Ex. 5 | Comp. Ex. 1 | Comp. Ex. 2 |
| --- | --- | --- | --- | --- | --- | --- | --- |
| Samples having defects due to air bubble generation | 0 | 0 | 0 | 0 | 0 | 15 | 0 |
| Samples having defects due to solar cell damage | 0 | 0 | 0 | 0 | 0 | 2 | 4 |

As shown in Table 1, it is found that although the samples of Comparative Example 2 did not show any defects due to air bubble generation, the number of samples having defects due to solar cell damage was higher than that of Comparative Example 1. In contrast, the solar cell module samples obtained in Examples 1 to 5 did not have an defects due to air bubble generation as well as solar cell damage, unlike Comparative Examples 1 and 2.

While the invention has been described with respect to the above specific embodiments, it should be recognized that various modifications and changes may be made to the invention by those skilled in the art which also fall within the scope of the invention as defined by the appended claims.

What is claimed is:

1. A solar cell module comprising an encapsulant sheet for solar cell modules which comprises a transparent non-brittle resin film having a plurality of hemispherical concave parts of non-identical dimensions, said hemispherical concave parts being formed on one or both surfaces of the transparent non-brittle resin film, wherein the hemispherical concave parts comprise 10 to 50% of hemispherical concave parts having a diameter (d1) of 500 to 750 μm and a depth (h) of 200 to 300 μm; 45 to 60% of hemispherical concave parts having a diameter (d1) of 750 to 1000 μm and a depth (h) of 300 to 400 μm; and 5 to 30% of hemispherical concave parts having a diameter (d1) of 1000 to 1200 μm and a depth (h) of 400 to 450 μm, based on the total number of the hemispherical concave parts, and wherein the encapsulant sheet is between a front protective film and a back protective film.

2. The solar cell modules of claim 1, wherein the transparent non-brittle resin film has a thickness of 200 to 1000 μm.

3. The solar cell module of claim 1, wherein the hemispherical concave parts are arranged randomly.

4. The solar cell module of claim 1, wherein the transparent non-brittle resin film is an ethylene-vinyl acetate copolymer film.

* * * * *